United States Patent
Todoroki et al.

(10) Patent No.: US 11,226,130 B2
(45) Date of Patent: Jan. 18, 2022

(54) VALVE CONTROL DEVICE, COOLING DEVICE, AND VALVE CONTROL METHOD

(71) Applicant: NEC CORPORATION, Tokyo (JP)

(72) Inventors: Koichi Todoroki, Tokyo (JP); Arihiro Matsunaga, Tokyo (JP); Masanori Sato, Tokyo (JP); Mizuki Wada, Tokyo (JP); Minoru Yoshikawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 225 days.

(21) Appl. No.: 16/477,935

(22) PCT Filed: Jan. 9, 2018

(86) PCT No.: PCT/JP2018/000161
§ 371 (c)(1),
(2) Date: Jul. 15, 2019

(87) PCT Pub. No.: WO2018/131555
PCT Pub. Date: Jul. 19, 2018

(65) Prior Publication Data
US 2020/0124313 A1    Apr. 23, 2020

(30) Foreign Application Priority Data
Jan. 16, 2017 (JP) .............................. JP2017-005182

(51) Int. Cl.
*F24F 11/84* (2018.01)
*F28F 27/00* (2006.01)
(Continued)

(52) U.S. Cl.
CPC .............. *F24F 11/84* (2018.01); *F25B 41/20* (2021.01); *F28F 27/00* (2013.01); *F25B 41/31* (2021.01);
(Continued)

(58) Field of Classification Search
CPC .. F24F 11/84; F24F 11/30; F24F 11/70; F24F 11/85; F25B 41/02; F25B 41/31;
(Continued)

(56) References Cited

U.S. PATENT DOCUMENTS 6,352,106 B1 * 3/2002 Hartman ............ G05D 23/1931
165/293
8,776,536 B2 * 7/2014 Benouali ................. F25B 41/31
62/56
(Continued)

FOREIGN PATENT DOCUMENTS

| JP | 2008-164250 A | 7/2008 |
|---|---|---|
| JP | 2009-194093 A | 8/2009 |

(Continued)

OTHER PUBLICATIONS

International Search Report of PCT/JP2018/000161 dated Mar. 27, 2018 [PCT/ISA/210].
(Continued)

*Primary Examiner* — Len Tran
*Assistant Examiner* — Jenna M Hopkins
(74) *Attorney, Agent, or Firm* — Sughrue Mion, PLLC (57) ABSTRACT

A valve control device includes a receiving unit, an opening degree control unit, and a fixing control unit. The receiving unit receives information concerning the measured temperature of a fluid to be cooled that is cooled by a vaporizer in a refrigerant circulation path that is equipped with the vaporizer and a condenser. The opening degree control unit variably controls the opening degree of a valve that controls the flow rate of the refrigerant that circulates through the circulation path in accordance with the difference between the measured temperature and a target temperature provided in advance. The fixing control unit fixes the opening degree of the valve with priority over variable control performed by
(Continued)

the opening degree control unit in the case where a fixing condition based on the difference between the measured temperature and the target temperature and a valve opening degree variation condition is satisfied.

9 Claims, 6 Drawing Sheets

(51) Int. Cl.
*F25B 41/20* (2021.01)
*F25B 41/31* (2021.01)

(52) U.S. Cl.
CPC . *F25B 2341/063* (2013.01); *F25B 2600/2513* (2013.01)

(58) Field of Classification Search
CPC ............ F25B 2341/31; F25B 2341/063; F25B 2600/2513; F28F 27/00
See application file for complete search history.

(56) References Cited

U.S. PATENT DOCUMENTS

| | | | |
|---|---|---|---|
| 9,874,880 B2 * | 1/2018 | Thuillard | ................. F24F 11/70 |
| 10,393,419 B2 * | 8/2019 | Ishimura | ................. F25B 13/00 |
| 2015/0135746 A1 | 5/2015 | Louvar | |
| 2016/0327322 A1 * | 11/2016 | Izadi-Zamanabadi | ....................... F25B 49/02 |

FOREIGN PATENT DOCUMENTS

| | | |
|---|---|---|
| JP | 2011-171499 A | 9/2011 |
| JP | 2012-037185 A | 2/2012 |
| JP | 2012-146331 A | 8/2012 |
| JP | 2012-243035 A | 12/2012 |
| WO | 2016/152111 A1 | 9/2016 |

OTHER PUBLICATIONS

Written Opinion of PCT/JP2018/000161 dated Mar. 27, 2018 [PCT/ISA/237].

* cited by examiner

VALVE CONTROL DEVICE, COOLING DEVICE, AND VALVE CONTROL METHOD

CROSS REFERENCE TO RELATED APPLICATIONS

This application is a National Stage of International Application No. PCT/JP2018/000161, filed Jan. 9, 2018, claiming priority to Japanese Patent Application No. 2017-005182, filed Jan. 16, 2017, the contents of all of which are incorporated herein by reference in their entirety.

TECHNICAL FIELD

The present invention relates to a technique for controlling a valve included in a cooling device.

BACKGROUND ART

Along with recent development of information society, an amount of information to be dealt with has been drastically increasing. In order to deal with such a large amount of information, a data center in which a large number of electronic devices, such as a server having a high information processing capability, are installed is provided. There is a demand for operating such a data center stably and economically.

In general, an electronic device having a high information processing capability has large power consumption, and a large part of the power consumption generates heat. Accordingly, when a large number of electronic devices each having a high information processing capability are installed in the data center, a temperature in the data center rises due to the heat discharge. In order to maintain a function of the electronic device, it is necessary to lower the temperature in the data center by an air conditioner. However, an amount of power consumption by the air conditioner is large, and thus reducing power consumption caused by the air conditioner becomes an economic issue.

Accordingly, a method is proposed in which an amount of heat to be released from an electronic device into a room is suppressed by absorbing heat from the electronic device and transporting the heat to another location, and as a result of suppressing an increase in an interior temperature in the data center, a load on an air conditioner is reduced and power consumption in the air conditioner is reduced. For example, a method of releasing heat of exhaust air from an electronic device to the outside air by directly transporting the exhaust air to the outside of a room without using an air conditioner is proposed.

As such a method of absorbing and transporting the entire or a part of exhaust heat from an electronic device, a technique using a phase-change cooling method using heat absorption during phase change of a refrigerant has been developed. Use of latent heat in the phase-change cooling method makes it possible to reduce an amount of refrigerant to be circulated, as compared with a water-cooling method. Accordingly, power required to circulate the refrigerant in the phase-change cooling method is smaller than that in the water-cooling method, and thus the phase-change cooling method is economical. In addition, the phase-change cooling method uses a refrigerant having an insulation property. Accordingly, the phase-change cooling method has a smaller effect on an electronic device than the water-cooling method even when the contained refrigerant leaks due to breakage or the like. Thus, the phase-change cooling method has attracted attention as a method of absorbing and transporting exhaust heat from an electronic device, such as a server, in a data center that is not allowed to be interrupted.

PTL 1 discloses a cooling system that employs a phase-change method. In this cooling system, a heat receiving unit is provided in the vicinity of a server, and a liquid-phase refrigerant flowing within the heat receiving unit is vaporized while absorbing exhaust air heat from the server as evaporation heat. Further, a radiation unit is provided at a location higher than the heat receiving unit, and the vaporized refrigerant that is vaporized by the heat receiving unit ascends and flows to the radiation unit, and is then cooled and condensed in the outside air by the radiation unit, whereby the exhaust air heat from the server is released to the outside. The cooled and condensed refrigerant is supplied to the heat receiving unit again, and the exhaust air heat from the server is absorbed by the heat receiving unit. In this cooling system, a flow path for the refrigerant is provided with a valve, and a flow rate of the refrigerant is adjusted by adjusting an opening degree of valve, thereby adjusting a degree of cooling of exhaust air. For example, PTL 1 discloses a control method of reducing a flow rate of supplying the refrigerant by reducing an opening degree of valve when a temperature of the cooled exhaust air is extremely lower than a target temperature.

Note that PTL 2 describes a configuration in which a refrigerant compressor is provided along a refrigerant circulation line, and the refrigerant compressor is operated when a temperature of outside air is high, for example, in summer, thereby reducing running cost through a year while suppressing a deterioration in radiation ability of the condenser due to a rise of a temperature of outside air. In addition, PTL 3 describes a vaporizer that supplies cool air to a server to be cooled by cooling hot air, and also describes a configuration for detecting an abnormality in the vaporizer. In addition, PTL 4 discloses a technique of fixing an opening degree of an interior expansion valve for controlling a flow rate of a refrigerant when hunting occurs in the temperature of the refrigerant and the temperature becomes unstable.

CITATION LIST

Patent Literature

[PTL 1] Japanese Unexamined Patent Application Publication No. 2009-194093
[PTL 2] Japanese Unexamined Patent Application Publication No. 2012-146331
[PTL 3] Japanese Unexamined Patent Application Publication No. 2012-037185
[PTL 4] Japanese Unexamined Patent Application Publication No. 2008-164250

SUMMARY OF INVENTION

Technical Problem

In the cooling system that employs the phase-change cooling method described in PTL 1, a temperature of exhaust air cooled by the heat receiving unit is measured and an opening degree of valve is adjusted based on the measured temperature. By the adjustment of the opening degree of valve as described above, the cooling efficiency can be enhanced by supplying an appropriate amount of refrigerant to the heat receiving unit depending on a load on the server to be cooled. In other words, when an amount of liquid-phase refrigerant in the heat receiving unit is extremely large, pressure of the refrigerant inhibits phase change, and only normal liquid cooling using sensible heat, instead of using latent heat with a large amount of heat transfer, is carried out, which leads to a deterioration in cooling efficiency. On the other hand, when an amount of liquid-phase refrigerant is insufficient, an amount of heat transportation by the refrigerant decreases, which leads to a deterioration in cooling efficiency. In view of the above, adjustment of the amount of refrigerant by adjusting the opening degree of valve facilitates enhancement of cooling efficiency.

However, there is a possibility that the adjustment of the opening degree of valve causes the following problems. Specifically, in the phase-change cooling method in which a large amount of heat is absorbed by a small amount of refrigerant, a measured temperature of exhaust air is liable to change, and thus the opening degree of valve is finely adjusted. Therefore, the valve frequently moves, and thus there is a tendency that a mechanical deterioration in the valve is promoted and a lifespan of the valve is shortened. These factors may cause a reduction in years of endurance of a facility for the cooling system. In addition, there is a need to reduce an interval between timings of performing maintenance for the facility in such a way as to stably operate the cooling system. This causes a problem that maintenance cost increases.

In addition, recently, a forced circulation method has been developed. In the method, heat is absorbed more actively based on calorific values that vary from hour to hour depending on an operation status of a server, and a refrigerant pump is used for circulating a refrigerant in order to forcibly transport exhaust air heat to the outside of a room. In such a cooling system, the opening degree of valve is more finely adjusted, and therefore, the problem due to a lifespan of the valve becomes more prominent.

The present invention has been made to solve the above-described problems. In other words, a principal object of the present invention is to provide a technique for suppressing shortening of a lifespan of a valve without incurring a reduction in cooling efficiency in a cooling system.

Solution to Problem

To achieve the above object, a valve control device of the present invention, as one aspect, includes:

a receiving unit for receiving information about a measured temperature of a fluid to be cooled, the fluid being cooled by a vaporizer of a circuit of refrigerant, the circuit of refrigerant including the vaporizer and a condenser and circulating a refrigerant, the vaporizer cooling the fluid to be cooled through exchange of heat between the fluid to be cooled and the refrigerant in the circuit of refrigerant, the condenser causing heat to be released from the refrigerant;

an opening control unit for varying an opening degree of valve depending on a difference between the measured temperature and a target temperature provided in advance, the opening degree of valve representing a degree of opening of a valve, the valve being provided along the circuit and controlling a flow rate of the refrigerant circulating through the circuit; and a fixation control unit for fixing an opening degree of valve with priority over variable control performed by the opening control unit when a fixation condition is satisfied, the fixation condition being based on the difference between the measured temperature and the target temperature and an opening degree variation status of the valve.

A cooling device of the present invention, as one aspect, includes:

a circuit that is provided with a vaporizer and a condenser and circulates a refrigerant, the vaporizer cooling a fluid to be cooled through exchange of heat between the fluid to be cooled and the refrigerant, the condenser causing heat to be released from the refrigerant;

a valve that is provided along the circuit and controls a flow rate of the refrigerant circulating through the circuit;

a thermometer that measures a temperature of the fluid to be cooled that is cooled by the vaporizer; and a valve control device that controls an opening degree of valve, the opening degree of valve representing a degree of opening of a valve, wherein the valve control device includes:

a receiving unit for receiving information about a measured temperature of the fluid measured by the thermometer;

an opening control unit for varying the opening degree of valve depending on a difference between the measured temperature and a target temperature provided in advance; and a fixation control unit for fixing the opening degree of valve with priority over variable control performed by the opening control unit when a fixation condition is satisfied, the fixation condition is based on the difference between the measured temperature and the target temperature and an opening degree variation status of the valve.

A valve control method of the present invention, as one aspect, includes:

receiving information about a measured temperature of a fluid to be cooled, the fluid being cooled by a vaporizer of a circuit of refrigerant, the circuit of refrigerant including the vaporizer and a condenser and circulating a refrigerant, the vaporizer cooling the fluid to be cooled through exchange of heat between the fluid to be cooled and the refrigerant in the circuit of refrigerant, the condenser causing heat to be released from the refrigerant;

varying an opening degree of valve depending on a difference between the measured temperature and a target temperature provided in advance, the opening degree of valve representing a degree of opening of a valve, the valve being provided along the circuit and controlling a flow rate of the refrigerant circulating through the circuit; and fixing an opening degree of valve with priority over variable control when a fixation condition is satisfied, the fixation condition being based on the difference between the measured temperature and the target temperature and an opening degree variation status of the valve.

Advantageous Effects of Invention

According to the present invention, it is possible to suppress shortening of a lifespan of a valve without incurring a reduction in cooling efficiency.

EXAMPLE EMBODIMENT

Example embodiments according to the present invention will be described below with reference to the drawings.

First Example Embodiment

Figure 1:
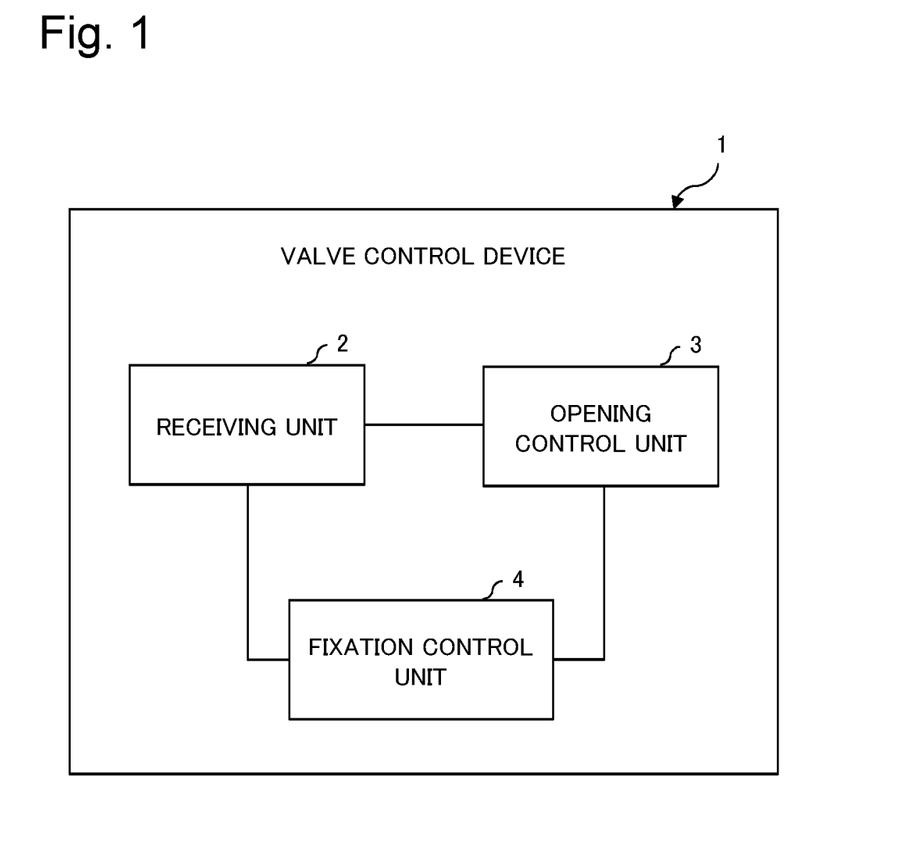
FIG. 1 is a block diagram illustrating a functional configuration of a valve control device according to a first example embodiment of the present invention.
Figure 2:
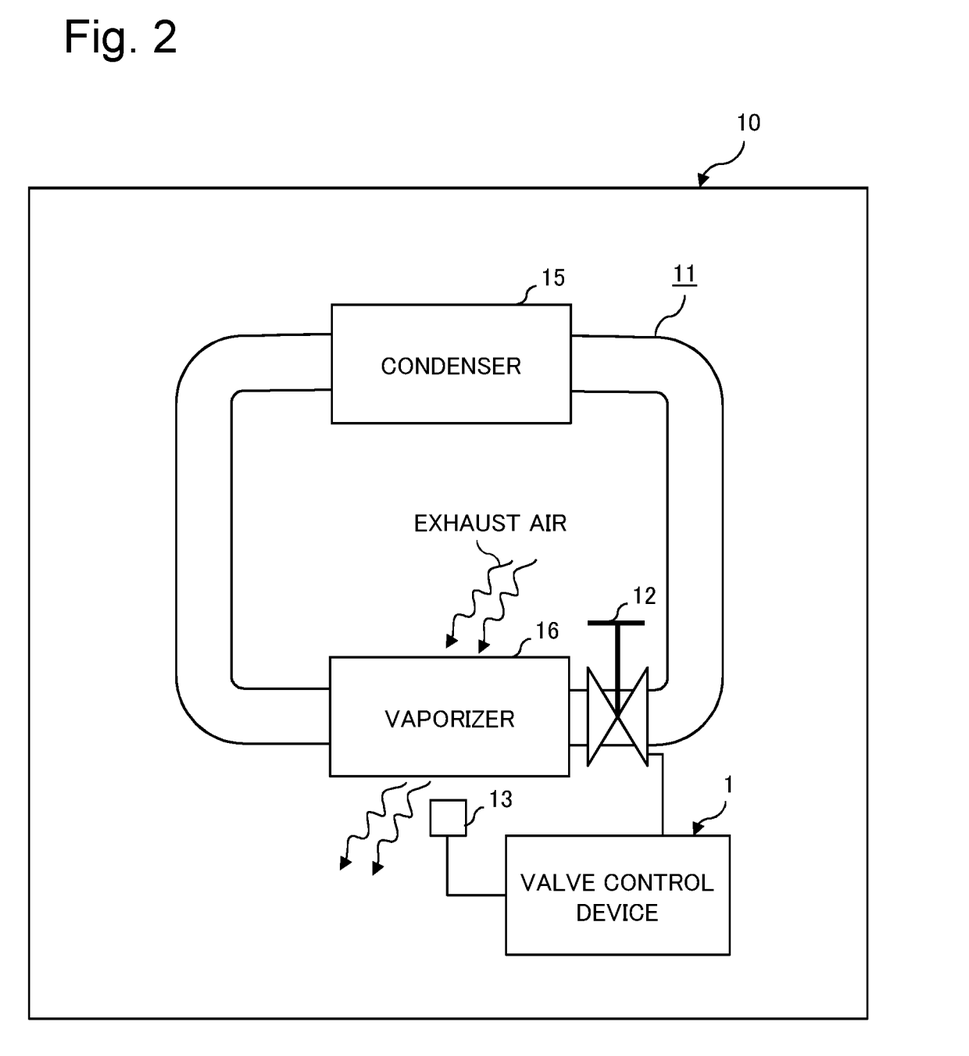
FIG. 2 is a diagram illustrating a configuration of a cooling device including the valve control device according to the first example embodiment.

FIG. 1 is a block diagram illustrating a functional configuration of a valve control device according to a first example embodiment of the present invention. FIG. 2 is a diagram illustrating a configuration of a cooling device incorporating the valve control device according to the first example embodiment.

A valve control device 1 according to the first example embodiment is a device that controls a valve 12 included in a cooling device 10 illustrated in FIG. 2. Specifically, the cooling device 10 includes a circuit 11 of refrigerant, the valve 12, and a thermometer 13.

The circuit 11 is a flow path through which a refrigerant is circulated. A vaporizer 16 and a condenser 15 are provided along the circuit 11. The vaporizer 16 is a part that cools a fluid to be cooled through exchange of heat between the fluid to be cooled (e.g., exhaust air that absorbs heat from an electronic device to cool the electronic device) and a refrigerant. The condenser 15 is a part in which the refrigerant flows from the vaporizer 16 and heat is released from the refrigerant. Specifically, in the circuit 11, the refrigerant receives heat (absorbs heat) from the fluid to be cooled in the vaporizer 16, thereby cooling the fluid to be cooled. Further, the refrigerant flows from the vaporizer 16 to the condenser 15, releases heat in the condenser 15, and then flows to the vaporizer 16 again in order to cool the fluid to be cooled.

The thermometer 13 is provided at, for example, a path through which the cooled fluid that is cooled by the vaporizer 16 flows, and has a configuration for measuring a temperature of the fluid.

The valve 12 is provided along the circuit 11, and has a configuration for varying a flow rate of the refrigerant flowing through the circuit 11 by varying the opening degree.

The valve control device 1 includes a function of controlling the opening degree of the valve 12. In the first example embodiment, as illustrated in FIG. 1, the valve control device 1 includes a receiving unit 2, an opening control unit 3, and a fixation control unit 4. The receiving unit 2 includes a function of receiving the measured temperature of the fluid from the thermometer 13. The fluid measured is to be cooled and cooled by the vaporizer 16 in the circuit 11. The opening control unit 3 includes a function of controlling (varying) the opening degree of the valve 12 in accordance with a difference between the measured temperature measured by the thermometer 13 and a target temperature provided in advance. The fixation control unit 4 includes a function of performing control to fix the opening degree of the valve 12 with priority over variable control performed by the opening control unit 3 when a fixation condition based on the difference between the measured temperature measured by the thermometer 13 and the target temperature and an opening degree variation status of the valve 12 is satisfied.

The valve control device 1 according to the first example embodiment controls the valve 12 by the function of the opening control unit 3 in such a way that the temperature of the fluid to be cooled reaches a target temperature, thereby controlling the flow rate of the fluid flowing through the circuit 11. As a result, the fluid to be cooled can be cooled to the target temperature. In addition, when the fixation condition is satisfied, the valve control device 1 fixes the opening degree of the valve 12 with priority over the opening control unit 3 by the function of the fixation control unit 4. For example, when a condition that the status of cooling by the cooling device 10 is stabilized is set as the fixation condition, the valve control device 1 fixes the opening degree of the valve 12 to thereby prevent the valve 12 from being moved, while maintaining a target cooling status. Thus, the valve control device 1 can suppress shortening of the lifespan of the valve 12.

Second Example Embodiment

A second example embodiment according to the present invention will be described below.

Figure 3:
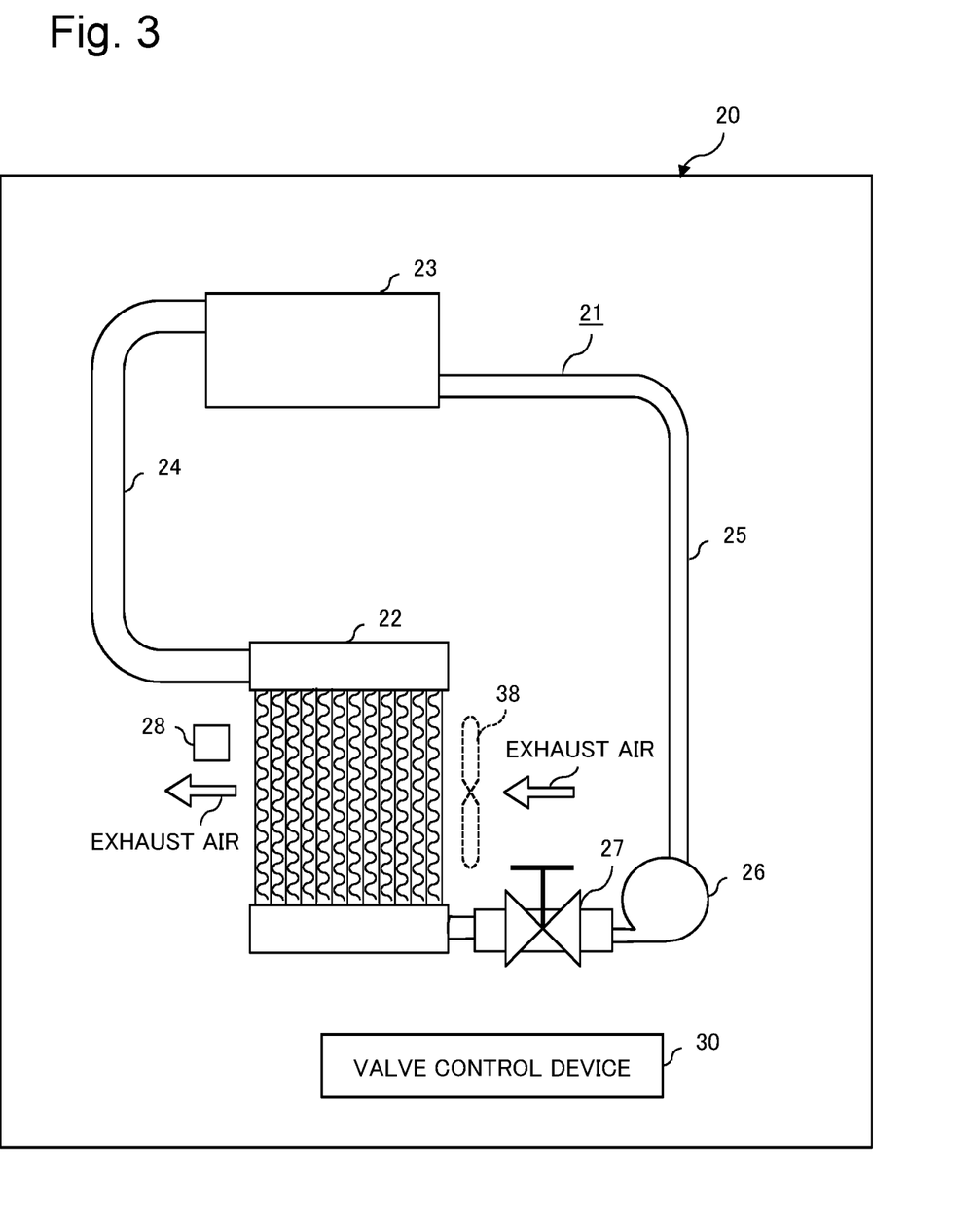
FIG. 3 is a diagram illustrating a configuration of a cooling device according to a second example embodiment.

FIG. 3 is a diagram illustrating a configuration of a cooling device including a valve control device according to the second example embodiment. A cooling device 20 is a phase-change cooling device, and includes a heat receiving unit 22 serving as a vaporizer, a radiation unit 23 serving as a condenser, a vapor passage 24, a liquid passage 25, a refrigerant pump 26, a valve 27, and a thermometer 28. The cooling device 20 further includes a valve control device 30.

The heat receiving unit 22 is disposed, for example, at an exhaust air side of a storage body (not illustrated) of an electronic device. The electronic device generates a high calorific value and is such as a server. Specifically, in the storage body of the electronic device, air suction and exhaust is performed by rotationally driving a fan 38, and an air (exhaust air) from which heat emitted from the electronic device is absorbed is discharged from the storage body. The heat receiving unit 22 is disposed on a path through which the exhaust air discharged from the storage body passes.

The heat receiving unit 22 includes a plurality of tubes. These tubes are arranged in parallel between a pair of headers, and both ends of the tubes are each connected to common headers. Further, a fin is disposed between the tubes. A refrigerant flows into one side of the pair of headers, and the refrigerant is branched from the header and flows to each tube, and then the refrigerant flowing through each tube merges at another side of the headers and flows out from the heat receiving unit 22.

In the heat receiving unit 22 having a configuration as described above, the exhaust air from which heat emitted from the electronic device is absorbed passes through a gap between fins, and is thereby cooled through exchange of heat between the exhaust air and the refrigerant flowing to the tube through the fins. In other words, the heat receiving unit 22 has a configuration for cooling the exhaust air through exchange of heat between the exhaust air and the refrigerant.

In the second example embodiment, a material whose phase is changed from a liquid phase to a gas phase due to heat received from the exhaust air by the heat receiving unit 22 is employed as the refrigerant. For example, considering that the refrigerant is used in an electronic device, specific examples of the refrigerant include hydrofluorocarbon (HFC) and hydrofluoroether (HFE) which are materials having insulation properties.

By employing such the refrigerant, in the heat receiving unit 22, the refrigerant absorbs heat from the exhaust air, whereby the phase of the refrigerant is changed from a liquid phase to a gas phase. Then, the gas-phase refrigerant flows out from the heat receiving unit 22.

One end side of the vapor passage 24 communicates with a refrigerant output side of the heat receiving unit 22, and another end side of the vapor passage 24 communicates with the radiation unit 23. The radiation unit 23 is disposed at a location higher than the heat receiving unit 22, and the gas-phase (vapor) refrigerant flowing out from the heat receiving unit 22 passes through the vapor passage 24 and flows to the radiation unit 23.

The radiation unit 23 has a configuration to cool the gas-phase refrigerant to change the phase of the refrigerant to the liquid phase through exchange of heat between the gas-phase refrigerant flowing in from the vapor passage 24 and water or air. The water or air that has received heat from the refrigerant is cooled by, for example, a chiller or cooling tower, and the chiller or cooling tower transports the heat from the water or air to the outside of a room from the inside of the room in which the cooling device 20 is disposed. Specifically, the heat generated by the electronic device is transported and discharged from the electronic device to, for example, the outside of the room, by ventilation using the fan 38, the refrigerant passing through the heat receiving unit 22, the vapor passage 24, and the radiation unit 23 in this order, and water or air that cools the radiation unit 23.

One end side of the liquid passage 25 communicates with the refrigerant output side of the radiation unit 23, and another end side of the liquid passage 25 communicates with the refrigerant input side of the heat receiving unit 22 through the refrigerant pump 26 and the valve 27. Note that when the phase of the refrigerant is changed from the liquid phase to the gas phase in the heat receiving unit 22, a volume of the refrigerant is expanded to about 1000 times its original size. In consideration of this, the vapor passage 24 is formed with a thickness larger than that of the liquid passage 25.

The refrigerant pump 26 is provided along the liquid passage 25, and includes a function of causing the refrigerant to flow from the radiation unit 23 toward the heat receiving unit 22 in the liquid passage 25.

In the second example embodiment, the heat receiving unit 22, the vapor passage 24, the radiation unit 23, the liquid passage 25, and the refrigerant pump 26 constitute the circuit 21 through which the refrigerant is circulated. In the circuit 21, the phase of the liquid-phase refrigerant is changed from the liquid phase to the gas phase, while the refrigerant cools the exhaust air by absorbing heat from the exhaust air by the heat receiving unit 22, and the gas-phase refrigerant is cooled by the radiation unit 23, whereby the phase of the refrigerant is changed from the gas phase to the liquid phase, and then the liquid-phase refrigerant is returned to the heat receiving unit 22. Thus, the refrigerant is circulated through the circuit 21 while changing its phase. Note that the circuit 21 is air-tightly sealed after the refrigerant is injected, and is then depressurized by vacuuming.

The valve 27 is provided along the circuit 21, and includes a function of controlling the flow rate of the refrigerant flowing through the circuit 21 by varying a cross-section (an opening degree) of a flow path through which the refrigerant flows.

As the valve 27, there are generally an electric valve and a solenoid valve. The electric valve has a configuration in which the valve is rotationally operated by a motor and a gear, thereby varying the cross-section (the opening degree) of the flow path through which a fluid (refrigerant) flows, and the flow rate of the fluid is thus controlled. This electric valve is often used in combination with a ball valve or a butterfly valve which is opened or closed by rotating the valve. The solenoid valve has a configuration in which the valve is linearly moved by a solenoid in a direction in which the flow path is opened or closed, thereby varying the cross-section (opening degree) of the flow path, and the flow rate of the fluid is thus controlled. The opening degree of each of the electric valve and the solenoid valve is variably controlled by controlling the motor or solenoid using an electric signal.

The valve of the solenoid valve is moved by a solenoid, and thus the solenoid valve requires power (i.e., consumes power) not only when the valve is moved in order to vary the opening degree, but also in a state where the opening degree is maintained. On the other hand, the electric valve consumes power when the valve is moved, and does not consume power when the opening degree is not changed, and thus the electric valve has an advantage that an amount of power consumption thereof is smaller than that of the solenoid valve. Meanwhile, since there are more movable parts in the electric valve than in the solenoid valve, degradation of parts of the electric valve due to friction or the like is more likely to occur than in the solenoid valve, and the lifespan of the electric valve is shorter than that of the solenoid valve.

In the second example embodiment, the thermometer 28 is disposed at a position where the temperature of the air (exhaust air) which has passed through the heat receiving unit 22 from the electronic device by rotationally driving the fan 38 can be measured. In other words, the thermometer 28 measures the temperature of the exhaust air (i.e., exhaust air cooled by the heat receiving unit 22) which has passed through the heat receiving unit 22. Examples of the thermometer 28 include a plurality of types such as a thermocouple and a platinum resistance temperature detector. In this case, an appropriate temperature instrument is employed as the thermometer 28 in consideration of an installation environment, an assumed measured temperature of fluid, a required measurement accuracy, and the like.

Figure 4:
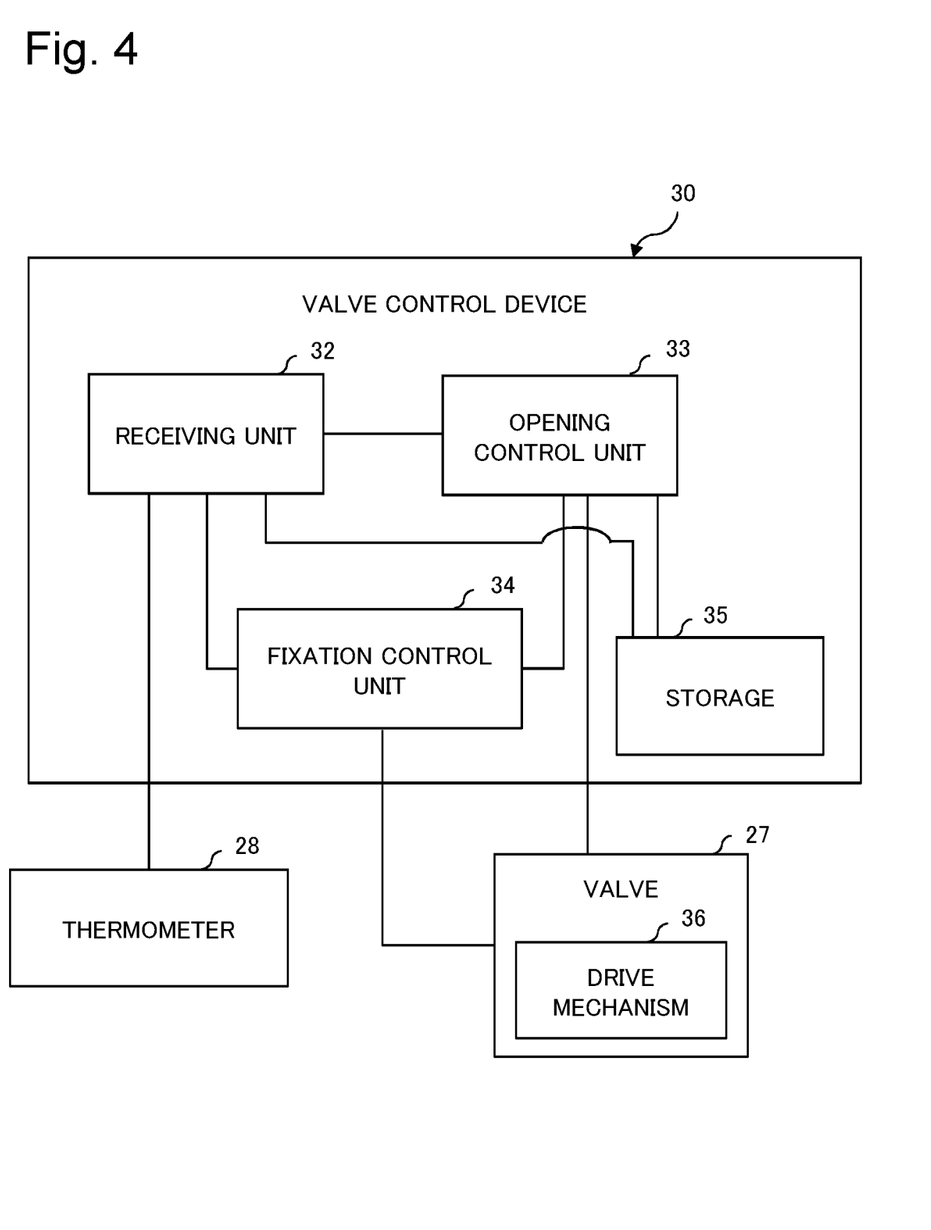
FIG. 4 is a block diagram illustrating a functional configuration of a valve control device according to the second example embodiment.

The valve control device 30 includes a function of controlling an opening degree of valve with respect to the valve 27. FIG. 4 is a block diagram illustrating a functional configuration of the valve control device 30. Specifically, the valve control device 30 includes, as functional units, a receiving unit 32, an opening control unit 33, a fixation control unit 34, and a storage 35. The storage 35 includes a storage medium capable of storing data and computer programs.

The receiving unit 32 includes a function of receiving an electric signal corresponding to the measured temperature output from the thermometer 28. Further, the receiving unit 32 includes a function of writing information representing the measured temperature (hereinafter, the measured temperature may be represented by using Tk) into the storage 35. The valve control device 30 incorporates, for example, a clock mechanism (not illustrated). In the case of writing information about the measured temperature Tk into the storage 35, the receiving unit 32 associates the measured temperature Tk with information about an acquisition time (a time when the receiving unit 32 receives information).

The opening control unit 33 is provided with a target temperature (hereinafter, the target temperature may be represented by using Tsp) of the exhaust air flowing out from the heat receiving unit 22. In this case, the temperature of cooling the exhaust air which can be realized by the heat receiving unit 22 is set as a target temperature Tsp in consideration of the temperature (ambient temperature) in the room in which the heat receiving unit 22 is installed, an air volume of the fan 38, cooling performance of the cooling device 20, and the like.

The opening control unit 33 includes a function of varying the opening degree of the valve 27 in accordance with a difference between the measured temperature Tk and the target temperature Tsp in order that the measured temperature Tk received by the receiving unit 32 is stabilized at the target temperature Tsp.

As variable control of the opening degree of the valve 27, for example, a Proportional Integral Differential (PID) control method is used. In the case of using the PID control method, the opening control unit 33 calculates the opening degree Or of the valve 27 based on the following Equation (1).

$$Or = G \times \left(e + \frac{1}{Ti} \Sigma e \times \Delta t + Td \frac{\Delta e}{\Delta t}\right) \quad (1)$$

In Equation (1), "Or" represents an opening degree of the valve 27, "e" represents the difference between the measured temperature Tk and the target temperature Tsp, and "t" represents time. Further, G, Ti, and Td represent parameters for determining a relative contribution ratio of a proportional term, an integral term, and a derivative term, respectively, and also referred to as a proportional gain, an integral time, and a derivative time, respectively. Values of these parameters are appropriately set in consideration of the performance of the cooling device 20 and the like.

The opening control unit 33 performs ON-OFF control and power amount control for power to be supplied to a drive mechanism (motor, solenoid, or the like) 36 for driving the valve of the valve 27 in such a way that the opening degree of valve 27 can be set to a calculated opening degree. Further, the opening control unit 33 includes a function of writing information about the calculated opening degree Or of the valve 27 into the storage 35 in a state where the information is associated with information about calculation time.

The fixation control unit 34 includes a function of fixing the opening degree of the valve 27 with priority over variable control of the opening degree of the valve 27 by the opening control unit 33 when a predetermined fixation condition is satisfied. The fixation condition is a condition that a status in which a fluctuation of the opening degree of the valve 27 is minimized and stable and the temperature of the exhaust air cooled by the heat receiving unit 22 reaches the target temperature Tsp. In this status, it is assumed that even when the opening degree of the valve 27 is fixed, the temperature of the exhaust air can be lowered to the target temperature Tsp or lower by the heat receiving unit 22. In other words, when the fixation condition is satisfied, the cooling device 20 can fix the opening degree of the valve 27 without deteriorating the cooling performance.

In the second example embodiment, a specific example of the fixation condition is a condition that a difference e (e=Tk−Tsp) between the measured temperature Tk and the target temperature Tsp is less than or equal to "0" and a standard deviation σ representing variation of the fluctuation in the opening degree of the valve 27 (opening degree fluctuation range) is less than or equal to a threshold α.

In this case, the fixation control unit 34 acquires, from the storage 35, information about the fluctuation of the opening degree of the valve 27 by control of the opening control unit 33, and calculates the standard deviation σ of the fluctuation of the opening degree of the valve 27 in a set detection period D. The detection period D is, for example, a period from a last temperature information acquisition timing to a time before a preliminarily set period.

Further, the fixation control unit 34 acquires the measured temperature Tk measured by the thermometer 28 from the receiving unit 32 or the storage 35, and calculates the difference e (e=Tk−Tsp) between the measured temperature Tk and the target temperature Tsp. Further, the fixation control unit 34 determines whether the fixation condition represented by Expression (2) is satisfied.

$$\begin{cases} e \leq 0 \\ \sigma \leq \alpha \end{cases} \quad (2)$$

In Expression (2), "α" represents a threshold. The threshold is a value based on which it is determined whether the fluctuation of the opening degree of the valve 27 by variable control of the opening control unit 33 is minimized and the opening degree is stable. The threshold is appropriately set.

When the fixation control unit 34 determines that the fixation condition represented by Expression (2) is satisfied, the fixation control unit 34 fixes the opening degree of the valve 27. In this manner, the fixation control unit 34 fixes the opening degree of the valve 27, the mobility of the movable part of the valve 27 is stopped. Accordingly, the cooling device 20 according to the second example embodiment can suppress shortening of the lifespan of the valve 27. Note that the fixation control unit 34 executes the operation of determining whether the fixation condition is satisfied at each preliminarily set time interval.

Further, the fixation control unit 34 includes a function of determining whether a cancel condition is satisfied when the opening degree of the valve 27 is being fixed, and cancelling an opening degree fixed state of the valve 27 when the cancel condition is satisfied.

As a specific example of the cancel condition, for example, a condition that the difference e between the measured temperature Tk and the target temperature Tsp is greater than "0" (e>0) is provided for the fixation control unit 34. In this case, the fixation control unit 34 determines whether the difference e between the measured temperature Tk and the target temperature Tsp is greater than "0" (e>0) when the opening degree of valve 27 is being fixed. This determination operation is carried out at each set time interval. When the fixation control unit 34 determines that the difference e between the measured temperature Tk and the target temperature Tsp is less than or equal to "0", the opening degree fixed state of the valve 27 is continued. Further, when the fixation control unit 34 determines that the difference e between the measured temperature Tk and the target temperature Tsp is greater than "0" (e>0), the fixation control unit 34 cancels the opening degree fixed state of the valve 27 in order to maintain an excellent cooling status of the cooling device 20.

Note that, as described above, the fixation control unit 34 cancels the opening degree fixed state of the valve 27 immediately after determining that e>0 is satisfied. Alternatively, when the opening degree of valve 27 is being fixed, if the fixation control unit 34 determines, by the determination operation at each set time interval, that e>0 is satisfied N consecutive times of being a preset upper limit value, the fixation control unit 34 may cancel the opening degree fixed state of the valve 27. The upper-limit value N is appropriately set in consideration of the installation environment in which the cooling device 20 is installed, the time interval at which the determination operation is performed, and the like. For example, it is assumed that when the installation environment of the cooling device 20 is air-conditioned by an air conditioner, a rapid change of the refrigerant flowing through the circuit 21 or the exhaust air passing through the heat receiving unit 22 is suppressed. Accordingly, the upper-limit value N is set to a relatively larger value than in a case where the installation environment is not air-conditioned. Specifically, in the cooling device 20 which employs a cooling method using the phase change of the refrigerant, a change in the state of the refrigerant due to the installation environment when the air is not conditioned is more rapid than when the air is conditioned. There is a possibility that the phase of the refrigerant may not be changed when variable control of the opening degree of the valve 27 is not carried out. In consideration of this, when the installation environment of the cooling device 20 is not air-conditioned, the upper-limit value N is set to a relatively small value, and when the installation environment of the cooling device 20 is air-conditioned, the upper-limit value N is set to a relatively large value. By setting the upper-limit value N to a relatively large value, the period in which the valve 27 is in the opening degree fixed state increases. Therefore, the cooling device 20 can better obtain the advantageous effect of suppressing shortening of the lifespan of the valve 27.

The receiving unit 32, the opening control unit 33, and the fixation control unit 34 which constitute the valve control device 30 have the configurations as described above. The receiving unit 32, the opening control unit 33, and the fixation control unit 34 are implemented in such a manner that, for example, a computer (central processing unit (CPU)) executes a computer program representing a procedure for processing these functions. Alternatively, the receiving unit 32, the opening control unit 33, and the fixation control unit 34 are configured by using arithmetic circuits including a control circuit that performs PID control.

Figure 5:
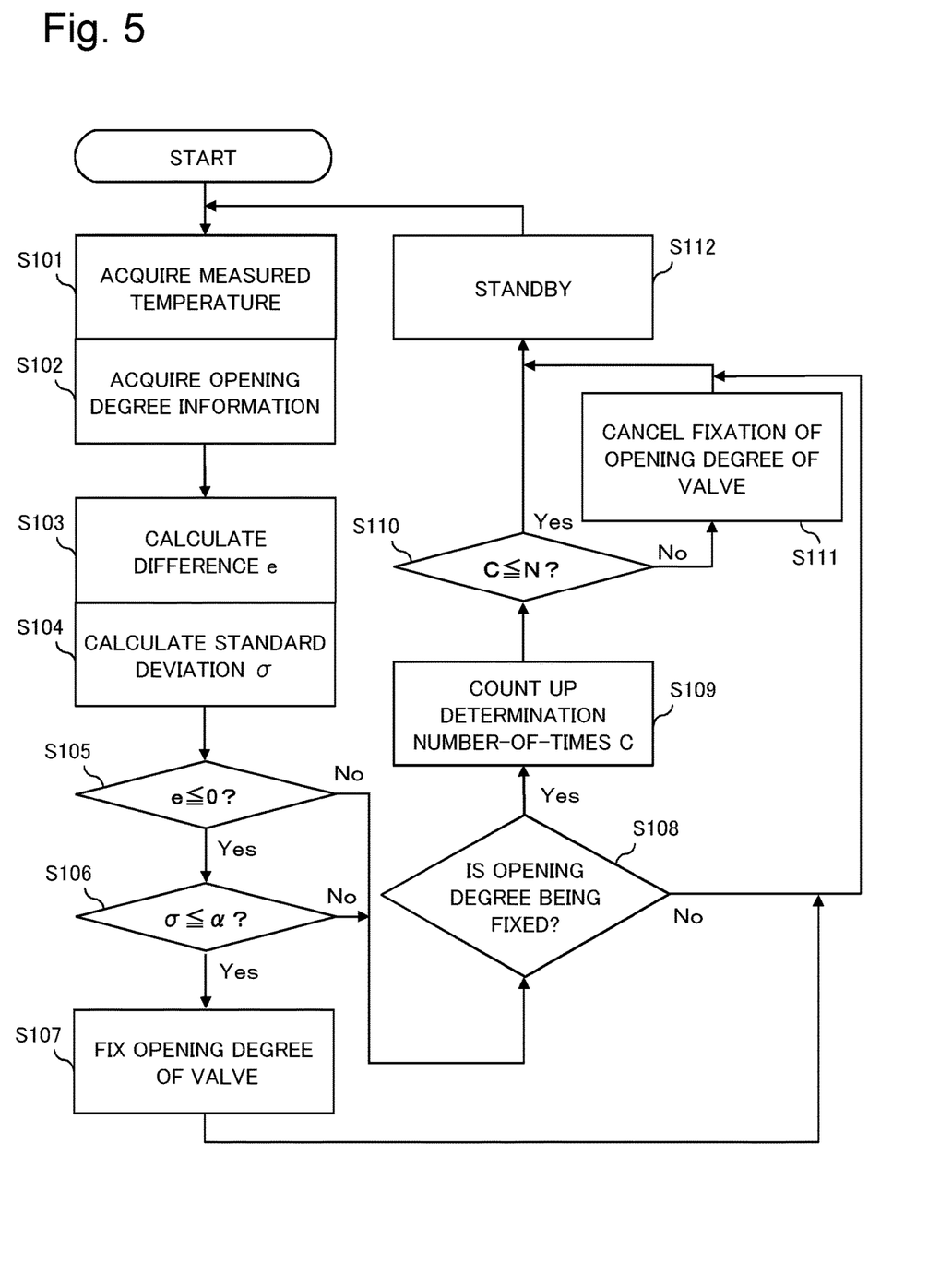
FIG. 5 is a flowchart illustrating an operation example of a fixation control unit of the valve control device according to the second example embodiment.

One example of the operation of the fixation control unit 34 in the valve control device 30 will be described below based on a flowchart illustrated in FIG. 5. For example, the fixation control unit 34 acquires information about the measured temperature Tk from the receiving unit 32 or the storage 35 at a preliminarily set information acquisition timing (step S101), and acquires information about the opening degree of the valve 27 from the storage 35 (step S102). In this case, the information about the opening degree acquired by the fixation control unit 34 from the storage 35 is a plurality of pieces of opening degree information associated with time information in the detection period D extending from the information acquisition timing at this time to a time before a set period.

Then, the fixation control unit 34 calculates the difference e (e=Tk−Tsp) between the measured temperature Tk and the target temperature Tsp (step S103). Further, the fixation control unit 34 calculates the standard deviation σ based on the plurality of pieces of opening degree information in the detection period D (step S104).

After that, the fixation control unit 34 determines whether the calculated difference e is less than or equal to "0" (step S105). Then, when the calculated difference e is less than or equal to "0", the fixation control unit 34 determines whether the calculated standard deviation σ is less than or equal to the threshold α (step S106). When the calculated standard deviation σ is less than or equal to the threshold α, it is assumed that the fixation control unit 34 can maintain the cooling performance required for the cooling device 20 even when the opening degree of the valve 27 is fixed. Accordingly, the fixation control unit 34 fixes the opening degree of the valve 27 (step S107). Then, the fixation control unit 34 is in a standby state while maintaining the opening degree fixed state of the valve 27 (step S112). After that, upon detecting that a preliminarily set standby period ends (in other words, a set information acquisition timing is reached), the fixation control unit 34 repeatedly performs the operations of the step S101 and subsequent steps.

Then, when the fixation control unit 34 determines that the difference e is less than or equal to "0" by the determination operation in the step S105, as described above, in the step S106, the fixation control unit 34 determines whether the standard deviation σ is less than or equal to the threshold α. In this case, since the opening degree of the valve 27 is being fixed, the standard deviation σ is less than or equal to the threshold α. Accordingly, in the step S107, the fixation control unit 34 maintains the opening degree fixed state of the valve 27. Then, in the step S112, the fixation control unit 34 is in the standby state.

Further, when the fixation control unit 34 determines that the difference e is greater than "0" by the determination operation in the step S105, the fixation control unit 34 determines whether the opening degree of the valve 27 is being fixed (step S108). Then, when the opening degree of the valve 27 is being fixed, the fixation control unit 34 counts up a determination number-of-times C representing the number of times of determination that the difference e is greater than "0" (step S109). After that, the fixation control unit 34 determines whether the determination number-of-times C is less than or equal to the preliminarily set upper-limit value N (step S110). When the determination number-of-times C is less than or equal to the upper-limit value N, the fixation control unit 34 is in the standby state while maintaining the opening degree fixed state of the valve 27 (step S112). After that, upon detecting that the preliminarily set standby period ends (in other words, the set information acquisition timing is reached), the fixation control unit 34 repeatedly performs the operations of the step S101 and subsequent steps.

Further, when the determination number-of-times C exceeds the upper-limit value N by the determination operation in the step S110 while the opening degree of the valve 27 is being fixed, the fixation control unit 34 resets the determination number-of-times C and cancels the opening degree fixed state of the valve 27 (S111). Then, the fixation control unit 34 is in the standby state (step S112) to be ready for starting a subsequent operation.

The cooling device 20 according to the second example embodiment includes the valve control device 30 including the fixation control unit 34, and therefore can fix the opening degree of the valve 27 while preventing a deterioration in cooling performance. Thus, since the movable part involved in the opening degree of the valve 27 can be prevented from being movable, degradation of parts due to friction of the movable part is suppressed, and thus shortening of the lifespan of the valve 27 is suppressed. As a result, the cooling device 20 can prevent such a problem that years of endurance are shortened due to degradation of parts concerning the movable part in the valve 27. As described above, in the electric valve, friction of the movable part involved in variability of the opening degree is more likely to occur than in the solenoid valve, and there is a concern about a reduction in years of endurance due to the friction. However, the concern about a reduction in years of endurance of such a valve can be reduced by employing the valve control device 30 according to the second example embodiment.

Thus, since the concern about years of endurance is reduced in this way, the electric valve is more likely to be employed for the cooling device 20. In addition, the power consumption in the electric valve is smaller than that in the solenoid valve, and thereby the electric valve can contribute to a reduction in power consumption of the cooling device 20.

Further, in the state where the cooling state of the cooling device 20 is stabilized, when the opening degree of the valve 27 is variably controlled by PID control, the opening degree of the valve 27 may greatly vary if a sudden disturbance that is not involved in the cooling state occurs. As a result, there is a possibility that a problem that the cooling state of the cooling device 20 becomes unstable may be caused. However, the cooling device 20 according to the second example embodiment fixes the opening degree of the valve 27 when the cooling state is stable. Consequently, another advantageous effect of preventing such a problem can be obtained.

Third Example Embodiment

A third example embodiment according to the present invention will be described below. Note that in the description of the third example embodiment, parts having the same name as that of constituent parts constituting the cooling device according to the second example embodiment are denoted by the same reference numerals, and repeated explanations of the same parts are omitted.

Figure 6:
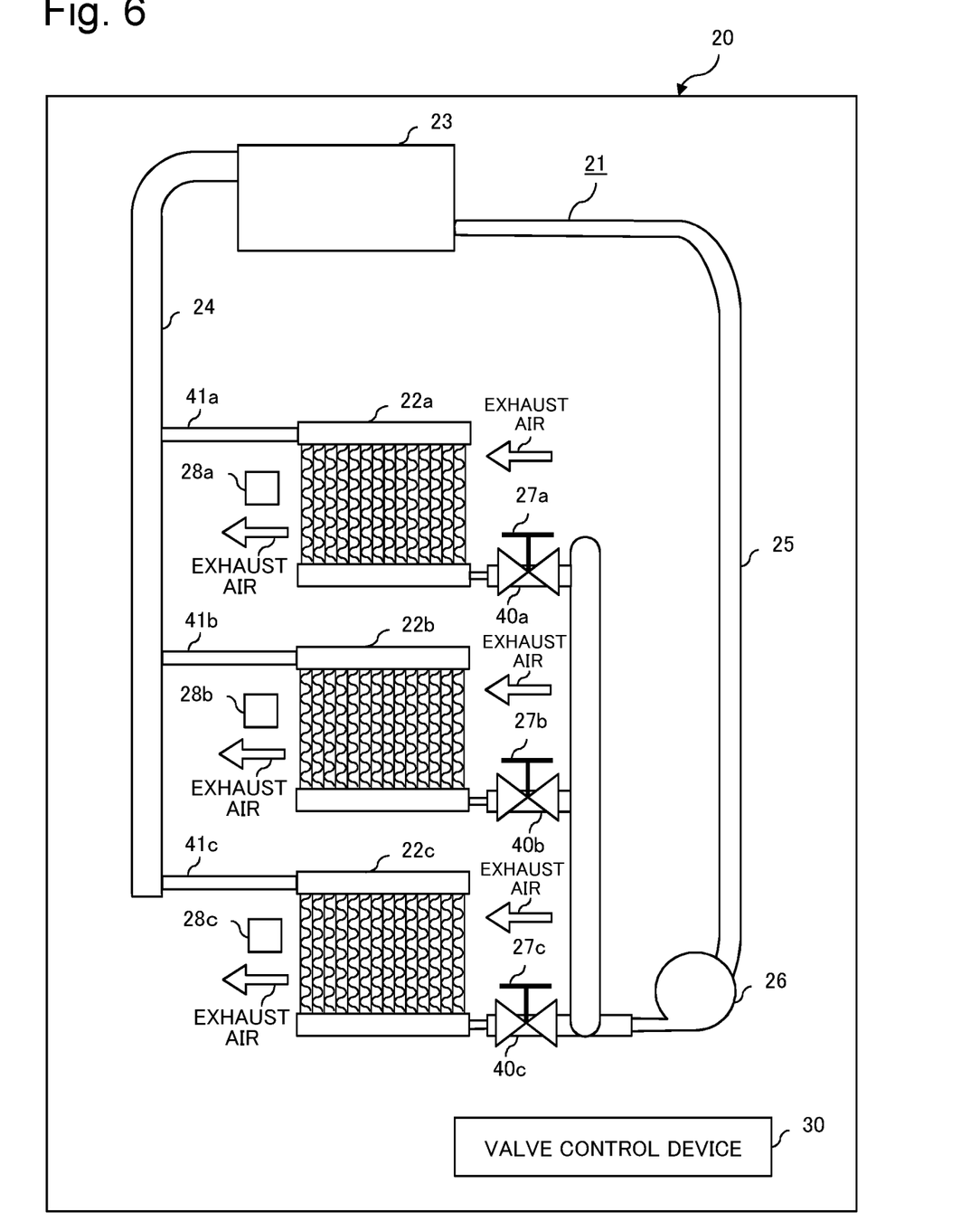
FIG. 6 is a diagram illustrating a configuration of a cooling device according to second to fourth example embodiments.

FIG. 6 is an explanatory diagram illustrating a configuration of a cooling device according to the third example embodiment in a simplified manner. A cooling device 20 according to the third example embodiment includes a plurality of heat receiving units 22a to 22c. Further, a liquid passage 25 is branched into branch passages 40a to 40c on a side that is closer to the radiation unit than the refrigerant pump 26. The branch passages 40a to 40c communicate with and are connected to the heat receiving units 22a to 22c respectively. Valves 27a to 27c are provided along the branch passages 40a to 40c, respectively.

Further, an end of a vapor passage 24 on the side that is closer to the radiation unit has, for example, a manifold-like form, and is connected to the heat receiving units 22a to 22c. In other words, an end of the vapor passage 24 on the side that is closer to the heat receiving unit is branched into branch passages 41a to 41c. The branch passages 41a to 41c communicate with and are connected to the heat receiving units 22a to 22c respectively.

Further, at the exhaust air downstream side of the heat receiving units 22a to 22c, thermometers 28a to 28c that measure the temperature of the exhaust air are disposed.

The receiving unit 32 of the valve control device 30 includes a function of receiving an electric signal relating to the measured temperature output from each of the thermometers 28a to 28c. Further, the receiving unit 32 includes a function of writing information about measured temperatures Tka, Tkb, and Tkc of the thermometers 28a to 28c into the storage 35. In the case of writing the information about measured temperatures Tka, Tkb, and Tkc into the storage 35, the receiving unit 32 associates the measured temperatures Tka, Tkb, and Tkc with information about an acquisition time and identification information about the thermometers 28a to 28c which have measured the temperatures.

The opening control unit 33 is provided with the target temperature Tsp that is common to the heat receiving units 22a to 22c (thermometers 28a to 28c). The opening control unit 33 performs variable control by, for example, PID control, to individually the opening degree of each of the valves 27a to 27c in accordance with differences $e_a$, $e_b$, and $e_c$ between measured temperatures Tka, Tkb, and Tkc and the target temperature Tsp.

The fixation control unit 34 individually fixes the opening degree of each of the valves 27a to 27c when a fixation condition is satisfied. The fixation condition is a condition that, in each of the valves 27a to 27c, the measured temperatures Tka, Tkb, and Tkc are less than or equal to the target temperature Tsp (differences $e_a$, $e_b$, and $e_c$ are less than or equal to "0"), and standard deviations $\sigma_a$, $\sigma_b$, and $\sigma_c$ representing variations in the opening degree of the valves 27a to 27c, respectively, are less than or equal to the threshold $\alpha$.

Further, when the measured temperatures Tka, Tkb, and Tkc are higher than the target temperature Tsp (differences $e_a$, $e_b$, and $e_c$ are greater than "0"), the fixation control unit 34 cancels the opening degree fixed state of each of the valves 27a to 27c. Note that, like in the second example embodiment, the fixation control unit 34 may cancel the opening degree fixed state of each of the valves 27a to 27c immediately after the differences $e_a$, $e_b$, and $e_c$ become greater than "0", or may cancel the opening degree fixed state of each of the valves 27a to 27c individually after a lapse of a set period.

Components other than the above-described components of the cooling device 20 in the third example embodiment are similar to those in the second example embodiment.

The cooling device 20 according to the third example embodiment can obtain the same advantageous effects as the second example embodiment. Further, the cooling device 20 can individually control the plurality of valves 27a to 27c. Accordingly, for example, when the statuses of the heat receiving units 22a to 22c are different from each other due to the fact that, for example, heat generation sources of the exhaust air cooled by the heat receiving units 22a to 22c are different from each other, the opening degrees of the valves 27a to 27c can be controlled depending on the statuses of the heat receiving units 22a to 22c, respectively.

Note that the third example embodiment illustrates an example in which the three heat receiving units 22a to 22c are disposed as heat receiving units. However, the number of heat receiving units is not limited, and two or four or more heat receiving units may be provided. As described above, when a plurality of heat receiving units are disposed and a plurality of valves are provided in such a way as to correspond to the heat receiving units, the opening control unit 33 and the fixation control unit 34 individually control the opening degree of valve corresponding to each heat receiving unit.

Fourth Example Embodiment

A fourth example embodiment according to the present invention will be described below. Note that in the description of the fourth example embodiment, parts having the same name as that of constituent parts constituting the cooling device according to each of the second and third example embodiments are denoted by the same reference numerals, and repeated explanations of the same parts are omitted.

Like the cooling device 20 according to the third example embodiment, a cooling device 20 according to the fourth example embodiment includes a plurality of heat receiving units 22a to 22c.

In the fourth example embodiment, the fixation control unit 34 of the valve control device 30 determines, for each of valves 27a to 27c, whether to fix the opening degrees of the valves 27a to 27c, and the following condition is used as the fixation condition for the determination. In other words, in the fourth example embodiment, the fixation condition is a condition that an average value E of differences $e_a$, $e_b$, and $e_c$ between measured temperatures Tka, Tkb, and Tkc and the target temperature Tsp is less than or equal to "0" and standard deviations $\sigma_a$, $\sigma_b$, and $\sigma_c$ representing variations in the opening degrees of the valves 27a to 27c, respectively, are less than or equal to the threshold $\alpha$.

Further, when the average value E of the differences $e_a$, $e_b$, and $e_c$ between the measured temperatures Tka, Tkb, and Tkc and the target temperature Tsp is greater than "0", the fixation control unit 34 cancels the opening degree fixed state of each of the valves 27a to 27c each having the opening degree fixed.

Components other than the above-described components of the cooling device 20 in the fourth example embodiment are similar to those of the cooling device 20 in the third example embodiment.

The cooling device 20 according to the fourth example embodiment controls the opening degrees of the valves 27a to 27c by using the average value E of the differences $e_a$, $e_b$, and $e_c$ between the measured temperatures Tka, Tkb, and Tkc and the target temperature Tsp by taking into consideration cooling of the refrigerant in all the heat receiving units 22a to 22c, not in each of the heat receiving units 22a to 22c. Accordingly, the cooling device 20 according to the fourth example embodiment can control the opening degree of each of the valves 27a to 27c and fix the opening degree, while maximizing the amount of heat to be received from the refrigerant by all the heat receiving units 22a to 22c.

Other Example Embodiments

Note that the present invention is not limited to the first to fourth example embodiments, and various example embodiments can be adopted. For example, in the second to fourth example embodiments, the refrigerant pump 26 is provided along the refrigerant circuit 21 constituting the cooling device 20. In place of this configuration, the present invention can also be applied to a cooling device or a valve control device of a type in which the refrigerant pump 26 in the circuit 21 is omitted. In the cooling device 20 in which the refrigerant pump 26 is omitted, power consumed for driving the refrigerant pump 26 is unnecessary. Therefore, the configuration in which the refrigerant pump 26 in the circuit 21 is omitted leads to a reduction in power consumption.

The whole or part of the example embodiments described above can be described as, but not limited to, the following supplementary notes.

(Supplementary Note 1)

A valve control device comprising:

a receiving unit for receiving information about a measured temperature of a fluid to be cooled, the fluid being cooled by a vaporizer of a circuit of refrigerant, the circuit of refrigerant including the vaporizer and a condenser and circulating a refrigerant, the vaporizer cooling the fluid to be cooled through exchange of heat between the fluid to be cooled and the refrigerant in the circuit of refrigerant, the condenser causing heat to be released from the refrigerant;

an opening control unit for varying an opening degree of valve depending on a difference between the measured temperature and a target temperature provided in advance, the opening degree of valve representing a degree of opening of a valve, the valve being provided along the circuit and controlling a flow rate of the refrigerant circulating through the circuit; and a fixation control unit for fixing an opening degree of valve with priority over variable control performed by the opening control unit when a fixation condition is satisfied, the fixation condition being based on the difference between the measured temperature and the target temperature and an opening degree variation status of the valve.

(Supplementary Note 2)

The valve control device according to supplementary note 1, wherein the fixation condition is a condition that the measured temperature is less than or equal to the target temperature and an opening degree fluctuation range of valve by the opening control unit in a predetermined detection period is less than or equal to a threshold.

(Supplementary Note 3)

The valve control device according to supplementary note 2, wherein a standard deviation of the opening degree of valve is used as information about the opening degree fluctuation range of valve by the opening control unit in the detection period, and wherein the fixation condition is a condition that the measured temperature is less than or equal to the target temperature and the standard deviation of an opening degree of valve by the opening control unit in the detection period is less than or equal to a threshold.

(Supplementary Note 4)

The valve control device according to any one of supplementary notes 1 to 3, wherein the fixation control unit cancels an opening degree fixed state in which the opening degree of valve is fixed, when a status is an opening degree fixed status and a cancel condition based on the measured temperature is satisfied.

(Supplementary Note 5)

The valve control device according to supplementary note 4, wherein the cancel condition is a condition that the measured temperature is higher than the target temperature.

(Supplementary Note 6)

The valve control device according to any one of supplementary notes 1 to 5, wherein a plurality of vaporizers are provided along the circuit in a parallel state, a plurality of valves are provided along the circuit in such a way as to be associated with each of the plurality of vaporizers and control the flow rate of the refrigerant of the associated vaporizers, and wherein the fixation control unit individually controls the opening degree of valve with respect to each of the plurality of valves based on a fixation condition, the fixation condition is based on a difference between measured temperature of the fluid to be cooled and associated with each of the plurality of vaporizers, and the target temperature.

(Supplementary Note 7)

The valve control device according to supplementary note 6, wherein the fixation condition is a condition for using an average value of each difference between a measured temperature of the fluid to be cooled and associated with each of the plurality of vaporizers, and the target temperature.

(Supplementary Note 8)

A cooling device comprising:

a circuit that is provided with a vaporizer and a condenser and circulates a refrigerant, the vaporizer cooling a fluid to be cooled through exchange of heat between the fluid to be cooled and the refrigerant, the condenser causing heat to be released from the refrigerant;

a valve that is provided along the circuit and controls a flow rate of the refrigerant circulating through the circuit;

a thermometer that measures a temperature of the fluid to be cooled that is cooled by the vaporizer; and a valve control device that controls an opening degree of valve, the opening degree of valve representing a degree of opening of a valve, wherein the valve control device includes:

a receiving unit for receiving information about a measured temperature of the fluid measured by the thermometer;

an opening control unit for varying the opening degree of valve depending on a difference between the measured temperature and a target temperature provided in advance; and a fixation control unit for fixing the opening degree of valve with priority over variable control performed by the opening control unit when a fixation condition is satisfied, the fixation condition is based on the difference between the measured temperature and the target temperature and an opening degree variation status of the valve.

(Supplementary Note 9)

The cooling device according to supplementary note 8, wherein the cooling device is a phase-change cooling device in which the vaporizer changes a phase of the refrigerant from a liquid phase to a gas phase and the condenser changes the phase of the refrigerant from the gas phase to the liquid phase.

(Supplementary Note 10)

A valve control method, comprising:

receiving information about a measured temperature of a fluid to be cooled, the fluid being cooled by a vaporizer of a circuit of refrigerant, the circuit of refrigerant including the vaporizer and a condenser and circulating a refrigerant, the vaporizer cooling the fluid to be cooled through exchange of heat between the fluid to be cooled and the refrigerant in the circuit of refrigerant, the condenser causing heat to be released from the refrigerant;

varying an opening degree of valve depending on a difference between the measured temperature and a target temperature provided in advance, the opening degree of valve representing a degree of opening of a valve, the valve being provided along the circuit and controlling a flow rate of the refrigerant circulating through the circuit; and fixing an opening degree of valve with priority over variable control when a fixation condition is satisfied, the fixation condition being based on the difference between the measured temperature and the target temperature and an opening degree variation status of the valve.

(Supplementary Note 11)

A program storage medium storing a computer program causing a computer to execute:

receiving information about a measured temperature of a fluid to be cooled, the fluid being cooled by a vaporizer of a circuit of refrigerant, the circuit of refrigerant including the vaporizer and a condenser and circulating a refrigerant, the vaporizer cooling the fluid to be cooled through exchange of heat between the fluid to be cooled and the refrigerant in the circuit of refrigerant, the condenser causing heat to be released from the refrigerant;

varying an opening degree of valve depending on a difference between the measured temperature and a target temperature provided in advance, the opening degree of valve representing a degree of opening of a valve, the valve being provided along the circuit and controlling a flow rate of the refrigerant circulating through the circuit; and fixing an opening degree of valve with priority over variable control when a fixation condition is satisfied, the fixation condition being based on the difference between the measured temperature and the target temperature and an opening degree variation status of the valve.

The present invention has been described above with reference to the example embodiments described above as exemplary examples. However, the present invention is not limited to the example embodiments described above. In other words, the present invention is applicable to various modes that can be understood by those skilled in the art within the scope of the present invention.

REFERENCE SIGNS LIST 1, 30 Valve control device
2, 32 Receiving unit
3, 33 Opening control unit
4, 34 Fixation control unit
10, 20 Cooling device
11, 21 Circuit
12, 27 Valve
13, 28 Thermometer
15 Condenser
16 Vaporizer
22 Heat receiving unit
23 Radiation unit

The invention claimed is:

1. A valve control device comprising:
a processor configured to:
receive information about a measured temperature of a fluid to be cooled, the fluid being cooled by a vaporizer of a circuit of refrigerant, the circuit of refrigerant including the vaporizer and a condenser and circulating a refrigerant, the vaporizer cooling the fluid to be cooled through exchange of heat between the fluid to be cooled and the refrigerant in the circuit of refrigerant, the condenser causing heat to be released from the refrigerant;
vary an opening degree of valve depending on a difference between the measured temperature and a target temperature provided in advance, the opening degree of valve representing a degree of opening of a valve, the valve being provided along the circuit and controlling a flow rate of the refrigerant circulating through the circuit; and
fix an opening degree of valve with priority over variable control when a fixation condition is satisfied, the fixation condition being based on the difference between the measured temperature and the target temperature and an opening degree variation status of the valve and being a condition that the measured temperature is less than or equal to the target temperature and an opening degree fluctuation range of valve in a predetermined detection period is less than or equal to a threshold.

2. The valve control device according to claim 1, wherein a standard deviation of the opening degree of valve is used as information about the opening degree fluctuation range of valve in the detection period, and
wherein the fixation condition is a condition that the measured temperature is less than or equal to the target temperature and the standard deviation of an opening degree of valve in the detection period is less than or equal to a threshold.

3. The valve control device according to claim 1, wherein the processor cancels an opening degree fixed state in which the opening degree of valve is fixed, when a status is an opening degree fixed status and a cancel condition based on the measured temperature is satisfied.

4. The valve control device according to claim 3, wherein the cancel condition is a condition that the measured temperature is higher than the target temperature.

5. The valve control device according to claim 1, wherein a plurality of vaporizers are provided along the circuit in a parallel state,
   a plurality of valves are provided along the circuit in such a way as to be associated with each of the plurality of vaporizers and control the flow rate of the refrigerant of the associated vaporizers, and
   wherein the processor individually controls the opening degree of valve with respect to each of the plurality of valves based on a fixation condition, the fixation condition is based on a difference between measured temperature of the fluid to be cooled and associated with each of the plurality of vaporizers, and the target temperature.

6. The valve control device according to claim 5, wherein the fixation condition is a condition for using an average value of each difference between a measured temperature of the fluid to be cooled and associated with each of the plurality of vaporizers, and the target temperature.

7. A cooling device comprising:
   a circuit that is provided with a vaporizer and a condenser and circulates a refrigerant, the vaporizer cooling a fluid to be cooled through exchange of heat between the fluid to be cooled and the refrigerant, the condenser causing heat to be released from the refrigerant;
   a valve that is provided along the circuit and controls a flow rate of the refrigerant circulating through the circuit;
   a thermometer that measures a temperature of the fluid to be cooled that is cooled by the vaporizer; and
   a valve control device that controls an opening degree of valve, the opening degree of valve representing a degree of opening of a valve, wherein
   the valve control device includes:
   a processor configured to:
   receive information about a measured temperature of the fluid measured by the thermometer;
   vary the opening degree of valve depending on a difference between the measured temperature and a target temperature provided in advance; and
   fix the opening degree of valve with priority over variable control when a fixation condition is satisfied, the fixation condition is based on the difference between the measured temperature and the target temperature and an opening degree variation status of the valve and is based on a condition that the measured temperature is less than or equal to the target temperature and an opening degree fluctuation range of valve in a predetermined detection period is less than or equal to a threshold.

8. The cooling device according to claim 7, wherein the cooling device is a phase-change cooling device in which the vaporizer changes a phase of the refrigerant from a liquid phase to a gas phase and the condenser changes the phase of the refrigerant from the gas phase to the liquid phase.

9. A valve control method, comprising:
   receiving, by computer, information about a measured temperature of a fluid to be cooled, the fluid being cooled by a vaporizer of a circuit of refrigerant, the circuit of refrigerant including the vaporizer and a condenser and circulating a refrigerant, the vaporizer cooling the fluid to be cooled through exchange of heat between the fluid to be cooled and the refrigerant in the circuit of refrigerant, the condenser causing heat to be released from the refrigerant;
   varying, by the computer, an opening degree of valve depending on a difference between the measured temperature and a target temperature provided in advance, the opening degree of valve representing a degree of opening of a valve, the valve being provided along the circuit and controlling a flow rate of the refrigerant circulating through the circuit; and
   fixing, by the computer, an opening degree of valve with priority over variable control when a fixation condition is satisfied, the fixation condition being based on the difference between the measured temperature and the target temperature and an opening degree variation status of the valve and being a condition that the measured temperature is less than or equal to the target temperature and an opening degree fluctuation range of valve in a predetermined detection period is less than or equal to a threshold.

* * * * *